United States Patent [19]

Ahne et al.

[11] 4,395,482
[45] Jul. 26, 1983

[54] METHOD FOR THE PREPARATION OF HEAT-RESISTANT RELIEF STRUCTURES USING POSITIVE RESISTS

[75] Inventors: Hellmut Ahne, Röttenbach; Eberhard Kühn, Hemhofen; Roland Rubner, Röttenbach, all of Fed. Rep. of Germany

[73] Assignee: Siemens Aktiengesellschaft, Munich, Fed. Rep. of Germany

[21] Appl. No.: 372,540

[22] Filed: Apr. 28, 1982

Related U.S. Application Data

[62] Division of Ser. No. 170,935, Jul. 18, 1980, Pat. No. 4,339,521.

[30] Foreign Application Priority Data

Aug. 1, 1979 [DE] Fed. Rep. of Germany ....... 2931297

[51] Int. Cl.$^3$ ................................................ G03C 5/00
[52] U.S. Cl. .................................... 430/326; 430/190; 430/192; 430/322; 430/330
[58] Field of Search ................... 204/159.18; 430/190, 430/192, 270, 306, 322, 326, 330

[56] References Cited

U.S. PATENT DOCUMENTS 4,093,461  6/1978  Loprest et al. ...................... 430/328
4,326,018  4/1982  Jargiello ............................. 430/330
4,339,521  7/1982  Ahne et al. ......................... 430/330

*Primary Examiner*—Jack P. Brammer
*Attorney, Agent, or Firm*—Kenyon & Kenyon

[57] ABSTRACT

The invention relates to heat-resistant positive resists based upon precursor stages of highly heat-resistant polymers and light-sensitive diazoquinones, as well as to a method for preparing heat-resistant relief structures of such positive resists. The positive resists of the type mentioned are developed in such a manner that they are heat-resistant as well as have a long storage life and are easily processed. The invention provides for the use of oligomer and/or polymer precursor stages of polyoxazoles in the form of polycondensation products of aromatic and/or heterocyclic dihydroxydiamino compounds and dicarboxylic acid chlorides or esters. The positive resists according to the invention are suitable especially for applications in microelectronics.

7 Claims, No Drawings

METHOD FOR THE PREPARATION OF HEAT-RESISTANT RELIEF STRUCTURES USING POSITIVE RESISTS

This is a division of application Ser. No. 170,935, filed July 18, 1980, now U.S. Pat. No. 4,339,521.

BACKGROUND OF THE INVENTION

The invention relates to heat-resistant positive resists based upon precursor stages of highly heat-resistant polymers and light-sensitive diazoquinones, as well as a method for the preparation of heat-resistant relief structures of such positive resists.

Heat-resistant and highly heat-resistant photo resists are required in a number of applications, particularly for the modern processes of structuring and doping of semiconductors, i.e., for dry-etching processes such as plasma etching or reactive ion etching, and for ion implantation. The resist materials and the corresponding relief structures made therefrom must not decompose at the high temperatures of such processes, and deviations or alterations in the dimensions of the relief structures, for example, by softening or distortion, also must not occur.

Conventional positive resists, such as those of the Novolake type, meet these increased thermal requirements only in part, i.e., they have limited dimensional heat stability. This, however, impairs the reliability of the processes in which these resists are used and adversely affects the advantages of the process such as steepness of the edges, fine structure, high etching and doping rate, and the like.

Heat resistant negative resists are known from U.S. Pat. Nos. 3,957,512; 4,045,223; 4,088,489 and Re. 30,186. While these negative photo resists are highly suitable for the preparation of highly heat-resistant relief structures, they are subject to the disadvantages which are inherent in negative resists. For, as compared to negative resists, positive resists are distinguished particularly by high resolution, short exposure times, the ability to utilize aqueous-alkaline developers, which is of importance ecologically and economically, and by the fact that the presence of oxygen has no effect on the exposure time.

From U.S. Pat. No. 4,093,461, a heat-resistant positive resist is known which comprises a light-sensitive o-quinone-diazide (o-diazoquinone) or o-naphthoquinone-diazide (o-diazonaphthoquinone) and a polyamido carboxylic acid in the form of a polycondensate product of an aromatic dianhydride and an aromatic diamino compound; the polyamido carboxylic acid, called "polyamic acid" in the mentioned patent, is a polymer precursor stage and more specifically, the polymer precursor stage of a polyamide.

However, it has now been found that this known positive resist composition has only limited storage life, because the diazoquinones exhibit only a very limited storage stability in the presence of acids. In addition, the stability of the mentioned photo resist to alkaline etching solutions is insufficient. Furthermore, the differences in the solubility between the exposed and the unexposed portions of the photo resist are relatively small.

SUMMARY OF THE INVENTION

It is an object of the present invention to provide positive resists of the type mentioned at the outset which contain precursor stages of polymers and are heat-resistant, have a long storage life and can readily be processed.

According to the invention, this and other objects are achieved by the provision that the positive resists contain oligomer and/or polymer precursor stages of polyoxazoles in the form of polycondensation products of aromatic and/or heterocyclic dihydroxydiamino compounds and dicarboxylic acid chlorides or esters.

The photoresists according to the invention are stable up to temperatures of 550° C. They therefore meet the more stringent requirements of modern dry-etching techniques and ion implantation processes. These positive resists are furthermore usable for alkaline wet etching processes. They can further be used in the form of a resist solution as well as in the form of a dry resist, i.e., using a carrier material for instance as a foil. The resists are suitable particularly for applications in microelectronics (preparation of finely structured patterns).

Additives common in positive resists, such as stabilizers, dyes or sensitizers and adhesion agents, can be added to the positive resists according to this invention.

The precursor stages of polyoxazoles contained in the positive resists according to the present invention are polyamido alcohols, preferably polyamido phenols. The precursor stages preferably have the following structure:

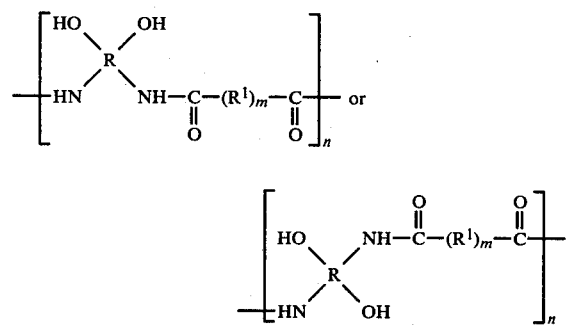

where n is a number from 2 to about 100 and m=0 or 1. The grouping R can have the following meaning:

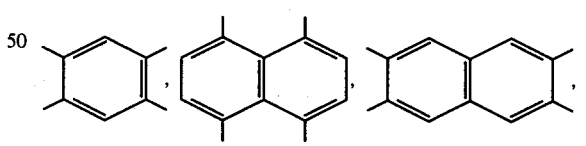

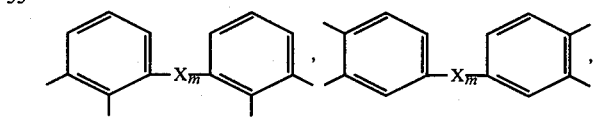

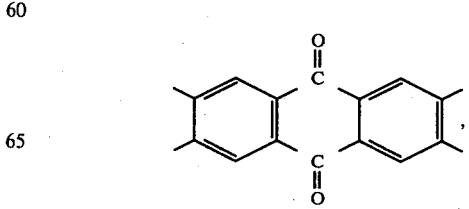

-continued

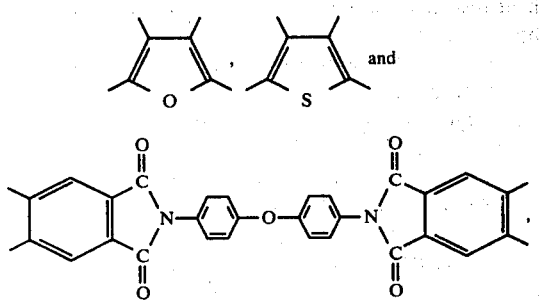

where m=0 or 1, and X means:

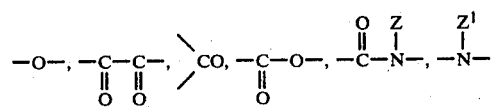

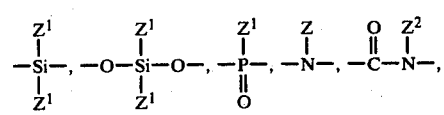

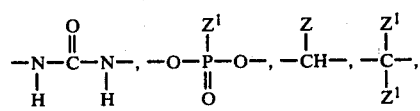

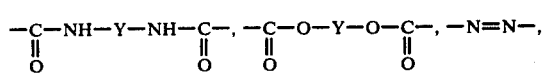

$-S-$, $-SO-$, $-SO_2-$, $-SO_2NH-$, 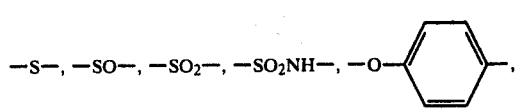

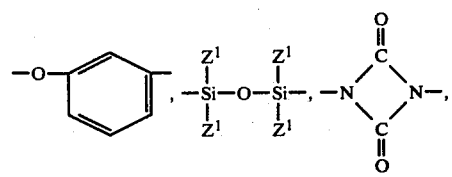

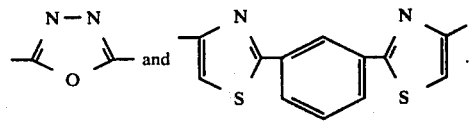

For the further radicals, the following applies:

Y = 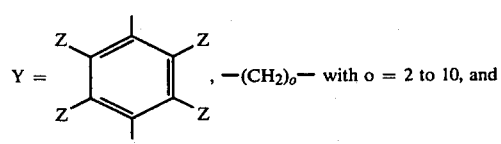, $-(CH_2)_o-$ with o = 2 to 10, and

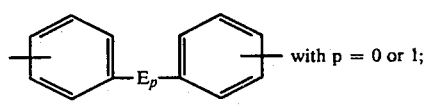 with p = 0 or 1;

Z=H or alkyl with 1 to 6 carbon atoms,
$Z^1$=alkyl with 1 to 10 carbon atoms or aryl, and
$Z^2$=aryl or heteroaryl.

E = 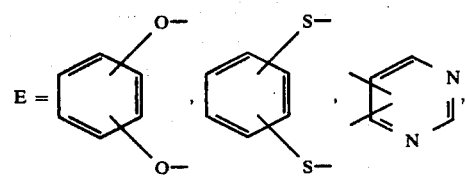

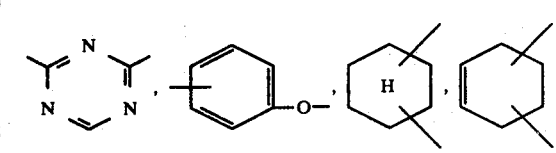

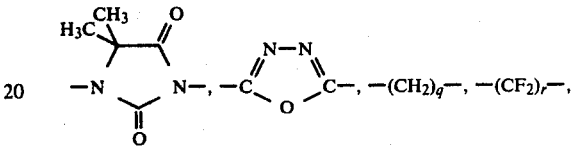

$-C-$, $-C-C-$, $-C-O-$, $-CH-$,

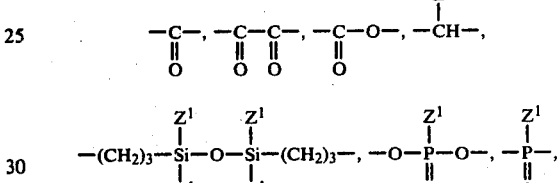

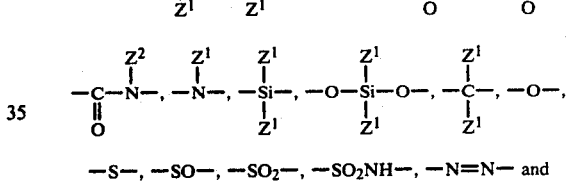

$-S-$, $-SO-$, $-SO_2-$, $-SO_2NH-$, $-N=N-$ and

where q=2 to 14 r=2 to 18: $Z^1$ and $Z^2$ are defined as above.

The grouping $R^1$ can have the following meaning, where H-atoms can also be substituted by Cl or Br:

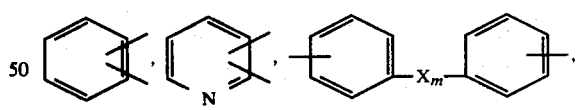

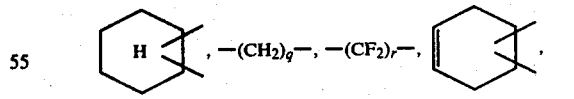, $-(CH_2)_q-$, $-(CF_2)_r-$,

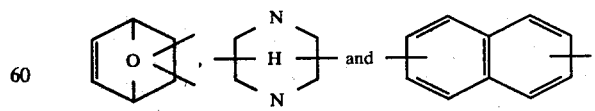

where: m=0 or 1; q=2 to 14; r=2 to 18. X has the meaning given above.

The oligomer or polymer polyoxazole precursor stages are prepared, as already explained, from aromatic or heterocyclic hydroxyl-group-containing diamines and dicarboxylic acid chlorides or esters. Preferably, aromatic diamines and aromatic dicarboxylic acid derivatives are used, with diamines having phenolic OH-groups being preferred (diamino diphenols). Especially suitable diamino diphenols are 3,3'-dihydroxy benzidine and 3,3'-dihydroxy-4,4'-diamino diphenyl ethers, and particularly suitable carboxylic acid derivatives are isophthalic-acid dichloride and terephthalic acid dichloride.

The polyoxazole precursor stages can be converted relatively simply into highly heat-resistant polyoxazoles by a thermal treatment. The polyoxazoles are stable in air and nitrogen up to temperatures of about 550° C. and exhibit excellent chemical resistance to solvents, acids and, particularly, alkaline solutions.

Light-sensitive diazoquinones (o-quinone diazides and o-naphthoquinone diazides are known, for example, from the following U.S. Pat. Nos.: 2,767,092; 2,772,972; 2,797,213; 3,046,118; 3,106,465; 3,148,983 and 3,669,658 (see in this connection also: W. S. DeForest, "Photoresist," McGraw-Hill Book Company, New York, 1975, pages 48 to 55).

For the positive resists according to the present invention, those diazoquinones which are insoluble in aqueous alkaline solutions, i.e., have strongly hydrophobic properties, and which, after exposure, are highly soluble in aqueous alkaline developers, are especially preferred. In addition, the diazoquinones should be highly compatible with the oligomer or polymer polyoxazole precursor stage and, in particular, should not crystallize out of the resist composition. Among the especially preferred diazoquinones with the mentioned properties are, for example, the following compounds:

N-dehydroabietyl-6-diazo-5(6)-oxo-1-naphthalin sulfonamide

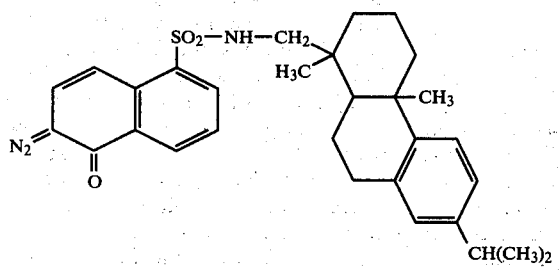

and the bis-naphthoquinone-(1,2)-diazide-(2)-5-sulfonic-acid ester of β,β-bis-(4-hydroxyphenyl)-propane

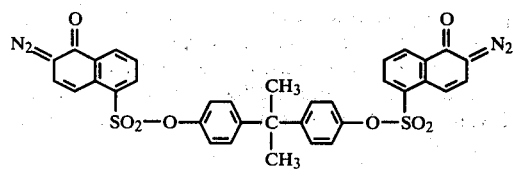

Other compounds are, for example: N-dehydroabietyl-3-diazo-4(3)-oxo-1-naphthalin sulfonamide, N-dehydroabietyl-5,6,7,8-tetrahydro-4-diazo-3(4)-oxo-2-naphthaline sulfonamide; and N-dextropimaryl-3-diazo-4-oxo-1,5-cyclohexadiene-1-sulfonamide.

To prepare heat-resistant relief structures, the positive resist, in the form of a layer or a foil, is placed on a substrate and is irradiated with actinic light through a mask or by deflecting a light, electron or ion beam. Subsequently, the exposed or irradiated portions of the layer or foil are dissolved or pulled off and the so-obtained relief structures are then annealed.

The photoresist can advantageously be dissolved in an organic solvent and applied to the substrate. To prepare this resist solution, the diazoquinone can be mixed with a solution of the oligomer or polymer precursor stage in N-methylpyrrolidone, dimethylformamide, dimethyl acetamide or a similar solvent, as a solid substance or also as a solution in one of the solvents mentioned. Preferably, N-methylpyrrolidone is utilized as the solvent. The weight ratio of the oligomer or polymer to the diazoquinone is generally about 1:20 to 20:1 and preferably about 1:10 to 10:1.

The concentration of the resist solution can be adjusted such that with the known coating methods such as centrifuging, immersion, spraying, brushing or rolling-on, layer thicknesses of 0.01 $\mu$m to several hundred $\mu$m can be produced. It has been found, for example, that with coating by centrifuge, 300 to 10,000 RPM for 1 to 100 seconds are suitable for obtaining a uniform and high surface quality. The photoresist layer applied to the substrate, which consists preferably of glass, metal, plastic or semiconductor material, can be freed of the solvent at room temperature or at elevated temperature, preferably at a temperature of about 50° to 120° C.; this can also be done in a vacuum.

To obtain a sufficient difference in the solubility between the irradiated and the non-irradiated layer or foil portions, exposure times between 1 and 600 seconds are sufficient (if a 500-W very-high pressure mercury lamp is used), depending on the resist composition employed and the layer thickness.

After the exposure, the exposed portions of the layer or foil are dissolved-out by means of an aqueous-alkaline developer. The developer may contain alkali metal salts of strong and weak acids such as sodium carbonate and sodium phosphate, or also sodium hydroxide and organic bases such as piperidine and triethanolamine, as well as surface-active substances. In general, the developer contains about 0.01 to 25% of a preferably organic base. The developing time is determined empirically and is about 5 to 190 seconds at room temperature.

By means of the positive resist according to the present invention, contour-sharp images, i.e., relief structures, are obtained which are converted by annealing into highly heat-resistant polymers which are extremely resistant against acids and particularly alkaline solutions. In general, temperatures from about 220° to 500° C. can be chosen; tempering or annealing is preferably carried out at temperatures of about 300° to 400° C. The tempering time is, in general, half an hour; no discoloration is observed in nitrogen as well as in air. The edge sharpness and the dimensional accuracy of the relief structures is practically unaffected by the anneal treatment. In addition, the high surface quality of the relief structures is preserved, although a loss of the layer thickness occurs in the annealing.

Especially remarkable is the resistance of the photo resists according to the invention to alkaline etching. In this manner, structures can be transferred to metal substrates, or foils or structured foils can be made by dissolving a metallic carrier foil which consists preferably of aluminum.

The relief structures prepared by the method according to the invention can find application for the preparation of passivating films on semiconductor components, of thin- and thick-film circuits, of solder protection layers on multi-layer circuits, of insulating layers as parts of multi-layer circuits and of miniaturized insulating layers on electrically conducting and/or semiconductor and/or insulating base materials, especially in the field of microelectronics or, in general, for the fine structuring of substrates. Preferably, the highly temperature-resistant relief structures serve as masks for wet and dry etching processes, electroless or electrolytic metal deposition and vapor-deposition processes, as well as masks for ion implantation. In addition, the relief structures may be used as insulating and protective layers in electrical technology. These relief structures also can be used to advantage as orientation layers, for example, in liquid-crystal displays as well as for rastering surfaces, for example, in X-ray screens, especially X-ray image amplifiers.

DETAILED DESCRIPTION OF THE INVENTION

The invention is explained in further detail with the aid of the following illustrative examples.

EXAMPLE I

By mixing the individual components, a photo resist solution with the following composition is prepared: 17 parts by weight of a polybenzoxazole precursor stage, prepared from 3,3'-dihydroxy-benzidine and isophthalic-acid chloride (cf., "Polymer Letter," Vol. 2, 1964, page 655), 17 parts by weight of the bis-naphthoquinone-(1,2)-diazide-(2)-5-sulfonic-acid ester of $\beta,\beta$-bis-(4-hydroxyphenyl)-propane and 200 parts by weight N-methylpyrrolidone.

The finished solution is filtered through a 0.8-$\mu$m filter and centrifuged on an aluminum foil. At 500 RPM, a layer thickness of 1.5 $\mu$m is obtained. The drying time is 90 minutes at a temperature of 60° C. in a vacuum. With a 500-W very-high pressure mercury lamp, exposure then takes place for 5 seconds through a contact mask, followed by spray development for 45 seconds with a 5-% sodium phosphate solution. Structures of about 2 $\mu$m with sharp edges are obtained which do not suffer color changes or degradation of the dimensional accuracy when being annealed in air at a temperature of 300° C. for 30 minutes. After the anneal, the layer thickness is 1.3 $\mu$m; after further annealing for one-half hour at 400° C., the layer thickness drops to 0.8 $\mu$m without change of the structures. Also, annealing for 14 hours at 350° C. does not impair the quality of the relief structures. The adhesion of the relief structures to the substrate is excellent.

EXAMPLE II

A solution of 20 parts by weight of the polybenzoxazole precursor stage according to Example I and 8 parts by weight of the bis-naphthoquinone-(1,2)-diazide-(2)-5-sulfonic-acid ester of $\beta,\beta$-bis-(4-hydroxyphenyl)-propane in 80 parts by volume N-methylpyrrolidone is filtered and is then centrifuged at 2000 RPM on an aluminum foil coated with hexamethyldisilazane. After drying for 2 hours in a vacuum at 60° C., the layer thickness is 13 $\mu$m. Exposure is then made with a 500-W very-high pressure mercury lamp for 6 minutes through a contact mask. After a development time of 2 minutes with a 10-% aqueous sodium-phosphate solution, relief images with sharp contours are obtained.

EXAMPLE III

A solution of 2 parts by weight of the polymer precursor stage described in Example I and 0.4 parts by weight of the diazonaphthoquinone according to Example I in 20 parts by volume N-methylpyrrolidone is centrifuged at 2000 RPM on an aluminum foil. After drying in a vacuum (90 minutes at 60° C.), layers 1.5 $\mu$m thick are obtained. After exposure for 10 seconds with a 500-W very-high pressure mercury lamp through a mask and subsequent developing with a 2.5% sodium phosphate solution (duration: 15 seconds), high-resolution ($\leq 2.5$ $\mu$m) relief structures with sharp edges are obtained.

EXAMPLE IV

The photo resist solution according to Example III is centrifuged on a silicon wafer coated with hexamethyldisilazane to form a film 3.6 $\mu$m thick. After an exposure of 6 seconds through a test mask with a 500-W very-high pressure mercury lamp and developing for 15 seconds with a 2.5-% sodium phosphate solution, relief structures with sharp edges and a resolution of 2 to 2.5 $\mu$m are obtained. After annealing for one hour at 300° C., the layer thickness drops to 2.5 $\mu$m and to 2.2 $\mu$m after heating for another half hour at 400° C. Resolution, adhesion and color of the relief structures are not affected by the annealing.

EXAMPLE V

The resist solution described in Example II is centrifuged at 1000 RPM to form films 22 $\mu$m thick on aluminum, is then exposed for 25 minutes with a 500-W very-high pressure mercury lamp to form an image, and is then developed for 4 minutes with a 10-% sodium phosphate solution. After 4 to 6 minutes, the structured foil can be removed from the substrate.

EXAMPLE VI

A photo resist solution prepared in accordance with Example I is centrifuged on an aluminum foil at 500 RPM to form a film 1.5 $\mu$m thick, is dried, exposed for 5 seconds through a contact mask with a 500-W very-high pressure mercury lamp and then developed for 45 seconds with a 5-% sodium phosphate solution. The aluminum foil with the polybenzoxazole relief structure annealed in accordance with Example I is placed for 2 minutes in a 5-% sodium hydroxide solution. While the aluminum substrate is etched in the process, the polybenzoxazole relief structure shows no impairment of the surface quality and the adhesion.

EXAMPLE VII

If the relief structure on aluminum described in Example VI is placed for 2 minutes in an acid bath of 800 parts by volume concentrated phosphoric acid, 50 parts by volume concentrated nitric acid, 50 parts by volume concentrated acetic acid and 100 parts by volume deionized water, structures 8 $\mu$m thick can be transferred into the aluminum.

EXAMPLE VIII

A positive resist solution of 2 parts by weight of the polybenzoxazole precursor stage described in Example I and 0.6 parts by weight N-dehydroabietyl-6-diazo-5(6)-oxo-1-naphthaline sulfonamide in 20 parts by volume N-methylpyrrolidone is centrifuged at 1000 RPM onto an aluminum foil pre-treated with hexamethyldisilazane and thereupon dried for 1 hour at 60° C. in a vacuum. After an exposure of 2 seconds with a 500-W very-high pressure mercury lamp through a mask, relief structures with sharp edges are obtained after immersion development of 30 seconds with a aqueous 2.5-% sodium phosphate solution. With a layer thickness of 1.6 μm, the resolution is about 1.8 μm.

What is claimed is:

1. A method for the preparation of heat-resistant relief structures, comprising:
   (a) applying to a substrate, in the form of a layer or foil, a heat-resistant positive resist comprised of (1) a precursor of a highly heat-resistant polymer and (2) a light-sensitive diazoquinone, said precursor comprising an oligomeric and/or polymeric precursor of a polyoxazole in the form of a polycondensation product of an aromatic and/or heterocyclic dihydroxydiamino compound and a dicarboxylic acid chloride or a dicarboxylic acid ester;
   (b) generating exposed or irradiated portions on said resist by treating said resist by a method selected from the group consisting of (1) exposing said resist through a mask with actinic light and (2) irradiating said resist by deflection of a light, electron or ion beam;
   (c) removing the exposed or irradiated portions from said layer or foil; and
   (d) annealing the relief structure so obtained.

2. A method according to claim 1 wherein said positive resist is dissolved in an organic solvent for application to the substrate.

3. A method according to claim 2 wherein said solvent comprises N-methylpyrrolidone.

4. A method according to claim 1 wherein said substrate comprises a member selected from the group consisting of glass, metal, plastic and semiconductor material.

5. A method according to claim 1 wherein said relief structure is annealed by heating to a temperature above 200° C.

6. A method according to claim 5 wherein said temperature is between about 300° and 350° C.

7. A method according to claim 1 wherein the annealed relief structure is dissolved off the substrate and transferred to another substrate.

* * * * *